US 11,152,949 B2

(12) United States Patent
Spagnolo (10) Patent No.: US 11,152,949 B2
(45) Date of Patent: Oct. 19, 2021

(54) PIPELINED SUCCESSIVE APPROXIMATION REGISTER ANALOG-TO-DIGITAL CONVERTER AND METHOD OF ANALOG-TO-DIGITAL CONVERSION

(71) Applicant: IMEC VZW, Leuven (BE)

(72) Inventor: Annachiara Spagnolo, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/023,358

(22) Filed: Sep. 16, 2020

(65) Prior Publication Data

US 2021/0083685 A1 Mar. 18, 2021

(30) Foreign Application Priority Data

Sep. 17, 2019 (EP) .................................... 19197789

(51) Int. Cl.
   *H03M 1/46* (2006.01)
   *H03K 3/356* (2006.01)
   *H03M 1/80* (2006.01)

(52) U.S. Cl.
   CPC ...... *H03M 1/462* (2013.01); *H03K 3/356104* (2013.01); *H03M 1/466* (2013.01); *H03M 1/804* (2013.01)

(58) Field of Classification Search
   CPC ...... H03M 1/462; H03M 1/804; H03M 1/466; H03K 3/356104
   USPC .......................................... 341/161–163, 172
   See application file for complete search history.

(56) References Cited

U.S. PATENT DOCUMENTS

| 7,990,210 | B2   | 8/2011  | Iida et al. |            |
|-----------|------|---------|-------------|------------|
| 7,999,719 | B2 * | 8/2011  | Jeon ......  | H03M 1/164 |
|           |      |         |             | 341/161    |
| 8,947,286 | B2 * | 2/2015  | Chen .....   | H03M 1/145 |
|           |      |         |             | 341/161    |
| 9,219,492 | B1 * | 12/2015 | Lok .......  | H03M 1/442 |
| 9,819,314 | B1 * | 11/2017 | Chiu .....   | H03M 1/125 |

OTHER PUBLICATIONS

Ranganathan S et al,"Discrete-time parametric amplification based on a three-terminal mos varactor: analysis and experimental results", IEEE Journal of Solid-State Circuits, IEEE, USA, vol. 38, No. 12, Dec. 2003 (Dec. 2003), pp. 2087-2093, XP011104258, ISSN: 0018-9200, DOI: 10.1109/JSSC.2003.819162.
Figueiredo et al,"The MOS Capacitor Amplifier, IEEE Transactions on Circuits and Systems—II", Express Briefs, vol. 51, No. 3, March 2004, p. 111-115.

(Continued)

*Primary Examiner* — Khai M Nguyen
(74) *Attorney, Agent, or Firm* — Moser Taboada (57) ABSTRACT

A pipelined successive approximation register analog-to-digital converter (2), SAR ADC, comprises a first SAR ADC stage (4); an inter-stage amplifier (6) for amplifying an analog residue from the first SAR ADC stage; and a second SAR ADC stage (8) input from the inter-stage amplifier, wherein the inter-stage amplifier (6) comprises one or more MOS transistors (16, 18), wherein the source and drain terminals of each of the one or more MOS transistors (16, 18) are connected to each other and may be toggled between ground and a supply voltage.

7 Claims, 6 Drawing Sheets

(56) References Cited

OTHER PUBLICATIONS

Lee C C et al: "A 12b 50MS/s 3.5mW SAR assisted 2-stage pipeline ADC", VLSI Circuits (VLSIC), 2010 IEEE Symposium on, IEEE, Piscataway, NJ, USA, Jun. 16, 2010 (Jun. 16, 2010), pp. 239-240, XP031744512, ISBN: 978-1-4244-5454-9.
Young-Deuk Jeon et al: "A 9.15mW 0.22mm$^2$ 10b 204MS/s pipelined SAR ADC in 65nm CMOS", Custom Integrated Circuits Conference (CICC), 2010 IEEE, IEEE, Piscataway, NJ, USA, Sep. 19, 2010 (Sep. 19, 2010), pp. 1-4, XP031786700, DOI: 10.1109/CICC. 2010.5617457, ISBN: 978-1-4244-5758-8.
Chun C Lee et al: "A SAR-Assisted Two-Stage Pipeline ADC", IEEE Journal of Solid-State Circuits, IEEE, USA, vol. 46, No. 4, Apr. 2011 (Apr. 2011), pp. 859-869, XP011351072, ISSN: 0018-9200, DOI: 10.1109/JSSC.2011.2108133.
Malki et al, A 70dB DR 10b 0-to-80MS/s Current-Integrating SAR ADC with Adaptive Dynamic Range, ISSCC 2012 / Session 27 / Data Converter Techniques / 27.7, Feb. 22, 2012 IEEE International Solid-State Circuits Conference.
Verbruggen et al,"A 1.7mW 11b 250MS/s 2× Interleaved Fully Dynamic Pipelined SAR ADC in 40nm Digital CMOS", ISSCC 2012 / Session 27 / Data Converter Techniques / 27.5, Feb. 22, 2012 IEEE International Solid-State Circuits Conference.
Verbruggen et al,"A 2.1 mW 11b 410 MS/s Dynamic Pipelined SAR ADC with Background Calibration in 28nm Digital CMOS", Aug. 16, 2013 Symposium on VLSI Circuits Digest of Technical Papers.
Malki et al, "A Complementary Dynamic Residue Amplifier for a 67 dB SNDR 1.36 mW 170 MS/s Pipelined SAR ADC"IEEE,2014.
Huang et al,"A 1.2-GS/s 8-bit Two-Step SAR ADC in 65-nm CMOS with Passive Residue Transfer", IEEE Asian Solid-State Circuits Conference, Nov. 9-11, 2015 / Xiamen, Fujian, China.
Bahubalindrunia et al, "A High-Gain, High-Speed Parametric Residue Amplifier for SAR-Assisted Pipeline ADCs", Jul. 28, 2016, 13th International Conference on Synthesis, Modeling, Analysis and Simulation Methods and Applications to Circuit Design (SMACD), IEEE, Jun. 27, 2016 (Jun. 27, 2016), pp. 1-4, XP032929718, DOI: 10.1109/SMACD.2016.7520732.
Vaz et al: A 13b 4GS/s Digitally Assisted Dynamic 3-Stage Asynchronous Pipelined-SAR ADC, ISSCC 2017 / Session 16 / Gigahertz Data Converters / 16.1, Feb. 7, 2017, IEEE International Solid-State Circuits Conference.
Singh Shreya et al: "A robust fully-dynamic residue amplifier for two-stage SAR assisted pipeline ADCs", 2017 IEEE International Symposium on Circuits and Systems (ISCAS), IEEE, May 28, 2017 (May 28, 2017), pp. 1-4, XP033156153, DOI: 10.1109/ISCAS.2017. 8050490.
Oshima et al, "A 0.11mm$^2$ 164dB-FOM 0.18μm CMOS Pipelined ADC with Novel Passive Amplification", Nov. 7, 2017.
Extended European Search Report in EP19197789.1, dated Mar. 25, 2020.

\* cited by examiner

PIPELINED SUCCESSIVE APPROXIMATION REGISTER ANALOG-TO-DIGITAL CONVERTER AND METHOD OF ANALOG-TO-DIGITAL CONVERSION

CROSS-REFERENCE TO RELATED APPLICATIONS

The present application claims priority to European Patent Application No. 19197789.1 filed on Sep. 17, 2019, incorporated herein by reference in its entirety.

TECHNICAL FIELD

The present inventive concept relates to pipelined successive-approximation-register analog-to-digital converter (SAR ADC), and to a method of analog-to-digital conversion.

BACKGROUND

Successive-approximation-register analog-to-digital converters (SAR ADCs) are known in the prior art. They are suitable in applications where low power consumption, in particular low power per conversion step, is required. To achieve a high conversion rate, two SAR ADC stages may be pipelined, connected an inter-stage amplifier. Conversion rates up to several hundreds of megasamples per second (MS/s) may be reached.

SUMMARY

An objective of the present inventive concept is to provide a high-conversion-rate SAR ADC with reduced power consumption.

According to a first aspect of the present inventive concept, there is provided a pipelined successive approximation register analog-to-digital converter, SAR ADC, comprising a first SAR ADC stage; an inter-stage amplifier for amplifying an analog residue from the first SAR ADC stage; and a second SAR ADC stage input from the inter-stage amplifier, wherein the inter-stage residue amplifier comprises one or more MOS transistors, wherein the source and drain terminals of each of the one or more MOS transistors are connected to each other and may be toggled between ground and a supply voltage.

The one or more MOS transistors provide a fully passive low-power and low-noise amplifier based on switchable gate capacitance, where transfer to or from the amplifier occurs through charge sharing. Hereby, the power consumption of the pipelined SAR ADC may be considerably reduced—a significant contribution to the power consumption of a pipelined SAR ADC may otherwise be due to the inter-stage amplifier—while still allowing for a high conversion rate, low noise and robustness against temperature and voltage variations.

In particular, power consumption of the pipelined SAR ADC is considerably reduced compared to using an operational amplifier as inter-stage amplifier.

Further, compared to using a dynamic amplifier as an inter-stage amplifier, the sensitivity of the amplifier to voltage and temperature variations is considerably reduced, removing the need for background calibration required to continuously monitor and adjust the gain, which otherwise increases circuit complexity and thereby power requirements and cost of the pipelined SAR ADC.

Compared to using no inter-stage amplifier at all, the resulting stringent noise requirements on the backend—especially if high resolutions are targeted—are reduced, the implementation of which also would result in an increase in power consumption.

According to one embodiment, the one or more MOS transistors comprise a complementary pair consisting of an NMOS transistor and a PMOS transistor. This further reduces the dependence on voltage variations. Further, clock feedthrough and common-mode shift are canceled and linearity is improved.

According to one embodiment, the pipelined SAR ADC is implemented in CMOS technology.

According to one embodiment, the second SAR ADC stage comprises an input capacitor connected to the gate terminal of each of the one or more MOS transistors. This allows for a reduction of the input capacitance of the second SAR ADC stage, which maximized the amplification of the inter-stage amplifier.

According to one embodiment, at least one of the first SAR ADC stage and the second SAR ADC stage is a charge redistribution SAR ADC stage.

In particular, each of the first SAR ADC stage and the second SAR ADC stage is a charge redistribution SAR ADC stage. This allows for a SAR ADC that, possibly with the exception of comparators in the ADC stages, has no active components, where in particular the residue transfer and the inter-stage amplification is performed in a fully passive way, further reducing power requirements.

According to a second aspect of the present inventive concept, there is provided a method of analog-to-digital conversion of an analog voltage, comprising performing a first successive approximation analog-to-digital conversion of the analog level; amplifying an analog residue from the first successive approximation by inputting the analog residue on the gate terminal of one or more MOS transistors, wherein the respective source and drain terminals of each of the one or more MOS transistors are connected to each other and may be toggled between ground and a supply voltage, and toggling the source and drain terminals of the one or more MOS transistors, resulting in an amplified voltage on the gate terminal; and performing a second successive approximation analog-to-digital conversion of the result of the amplifying.

Advantages and embodiments of this second aspect are at least the same as and/or compatible with those described above in conjunction with the first aspect.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
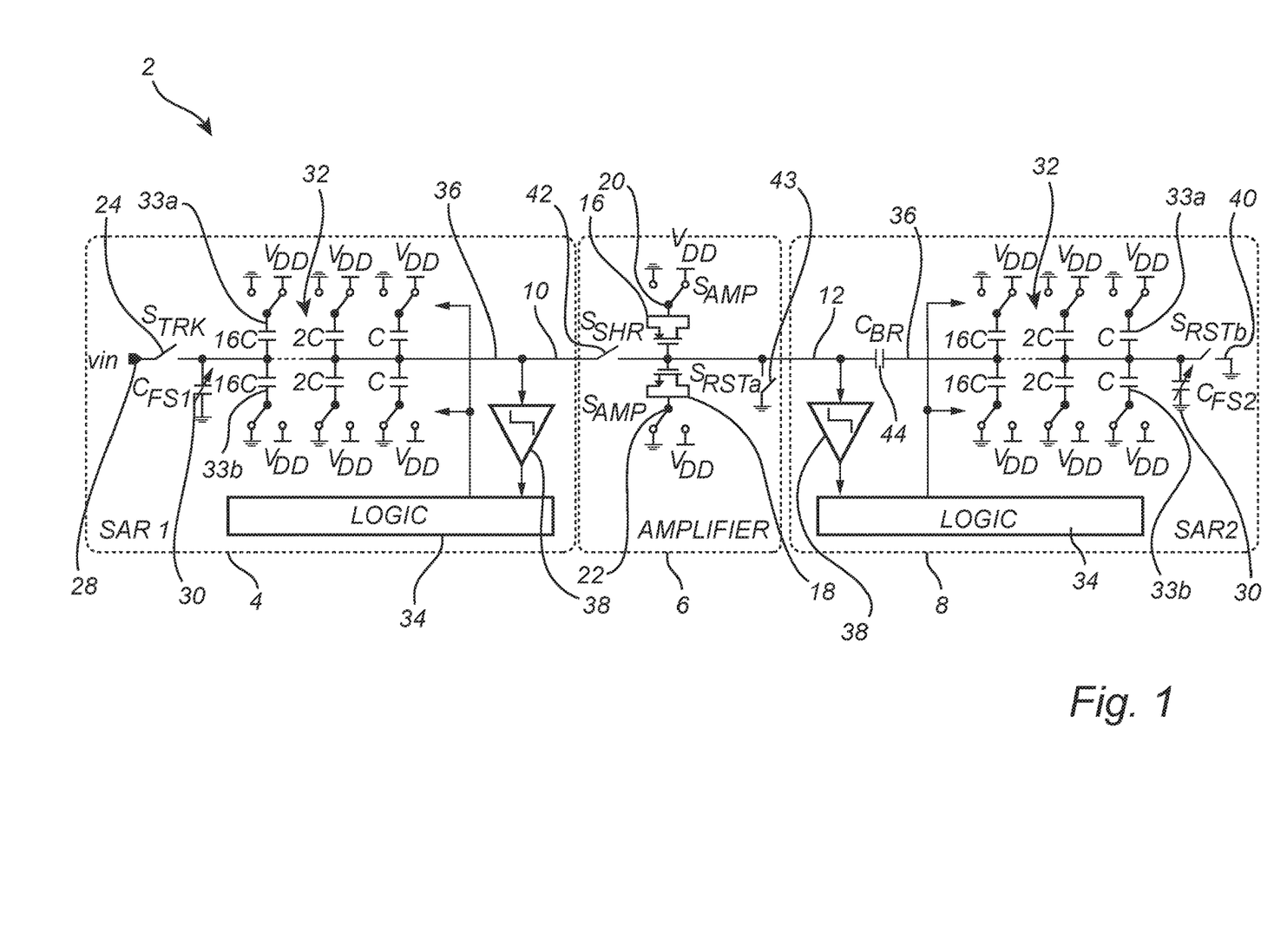
FIG. 1 is a schematic drawing of a pipelined successive approximation register analog-to-digital converter (SAR ADC).

FIG. 1 shows a pipelined successive approximation register analog-to-digital converter (SAR ADC) 2. The SAR ADC 2 comprises a first SAR ADC stage 4; an inter-stage amplifier 6; and a second SAR ADC stage 8. The inter-stage amplifier is connected to the first SAR ADC stage 4 on an output line 10 of the first SAR ADC stage 4. In turn, the amplified voltage output from the inter-stage amplifier 6, is input to the second SAR ADC stage 8 on a line 12. Each of the stages of the pipelined SAR ADC may be implemented in CMOS technology, and may be comprised in a System-on-Chip.

At least one of the first SAR ADC stage 4 and the second SAR ADC stage 8, may be a charge redistribution SAR ADC stage. For example, as depicted, each of the first SAR ADC stage 4 and the second SAR ADC stage 8 may be a charge redistribution SAR ADC stage.

The first SAR ADC stage 4 is connected to an input line vin 28 through a normally-open switch 24, controlled by a signal line $S_{TRK}$, to a common bus 36.

Each capacitor 32 of a plurality of capacitors is at one connected to the common bus 36 and at its other end switchably connected to be toggled between a supply voltage $V_{DD}$ and ground. The plurality of capacitors comprises capacitors 32 with values that are powers of 2 of a capacitance C. The number of capacitors, and thereby the number of powers of 2, depend on the resolution of the SAR ADC stage 4. In the depicted example, the plurality of capacitors comprises capacitors 32 with capacitances C, 2C, 4C, 8C, and 16C, for a resolution of 5 bits. As depicted, each capacitance may be represented by two capacitors 32 in the plurality of capacitors, to provide a dual DAC structure to keep constant the common mode voltage at each comparator cycle.

Further, an adjustable, programmable capacitor 30 with capacitance $C_{FS1}$ is connected between the common bus 36 and ground for to adjusting the full scale of the first SAR ADC stage 4.

The common bus 36 is connected to the switch 42 of the inter-stage amplifier 6 (see below), for outputting a residue voltage of the first SAR ADC stage 4 after analog-to-digital conversion. Switching of the plurality of capacitors 32, the programmable capacitor and the switch 24 is controlled by a logic block 34. A comparator 38 is connected to the common bus 36 and outputting its result to the logic block 34.

Similarly, an input 12 of the second SAR ADC stage 8 is connected to an output 12 of the inter-stage amplifier 6. An optional input series capacitor 44 with capacitance $C_{BR}$ is connected between the input 12 and a common bus 36 to reduce the input capacitance of the second SAR ADC stage.

Each capacitor 32 of a plurality of capacitors is at one connected to the common bus 36 and at its other end switchably connected to be toggled between the supply voltage $V_{DD}$ and ground. The plurality of capacitors comprises capacitors 32 with values that are powers of 2 of a capacitance C. The capacitance C of the second SAR ADC stage 8 may be different from the capacitance C of the first SAR ADC stage 4. The number of capacitors, and thereby the number of powers of 2, depend on the resolution of the SAR ADC stage 4. In the depicted example, the plurality of capacitors comprises capacitors 32 with capacitances C, 2C, 4C, 8C, and 16C, for a resolution of 5 bits. As depicted, each capacitance may be represented by a pair of capacitors comprising an upper capacitor 33a and a lower capacitor 33b in the plurality of capacitors 32, wherein the upper capacitor 33a, during operation, is pre-charged to the supply voltage $V_{DD}$ and the lower capacitor 33b is pre-charged to ground. This provides a dual DAC structure to keep constant the common mode voltage at each comparator cycle.

Further, an adjustable, programmable capacitor 30 with capacitance $C_{FS2}$ is connected between the common bus 36 and ground for adjusting the full scale of the second SAR ADC stage 8.

The common bus 36 is connected to ground through a normally open switch 43 controlled by a signal line $S_{RSTb}$. Switching of the plurality of capacitors 32, the programmable capacitor and the switch 40 is controlled by a logic block 34. A comparator 38 is connected to the input 12 and outputting to the logic block 34.

Figure 4:
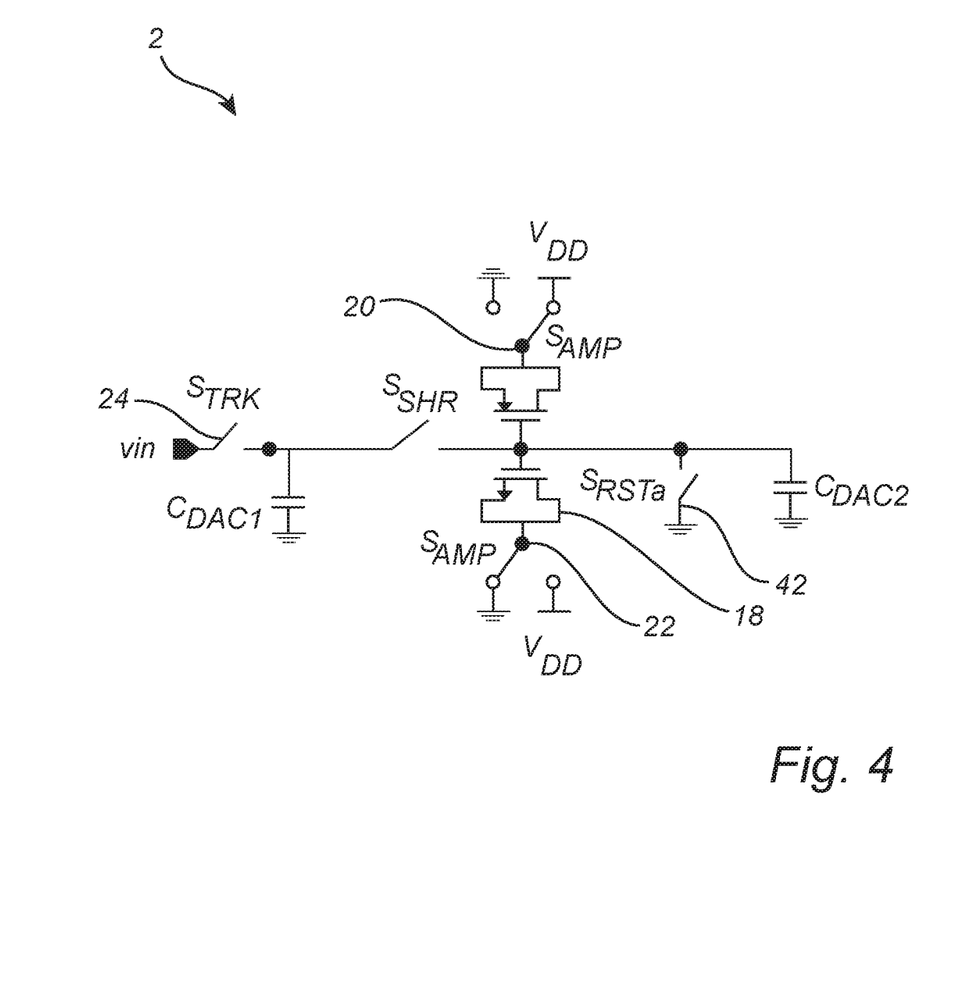
FIG. 4 is a detailed schematic of the inter-stage residue amplifier.

With reference for FIGS. 1 and 4, an inter-stage residue amplifier 6, connected between the first SAR ADC stage 4 and the second SAR ADC stage 8, is configured to amplifying a residue voltage output on the output line 10 of the first SAR ADC stage 4.

The inter-stage amplifier 6 comprises one or more MOS transistors, for example, as depicted, a complementary pair of an PMOS transistor 16 and a NMOS transistor 18. The source and drain terminals of each of the PMOS transistor 16 and the NMOS transistor 18 are connected to each other and to a respective switch 20, 22, both controlled by a signal line $S_{AMP}$, so that the respective source and drain terminals may be toggled between ground and a supply voltage $V_{DD}$.

The gate terminals of the PMOS transistor 16 and the NMOS transistor 18 are connected to the output line 10 of the first SAR ADC stage 4 through a normally-open switch 42 controlled by a signal line $S_{SHR}$ and to the output 12 of the inter-stage amplifier 12, which is connected to ground through a normally-open switch 43 controlled by a signal line $S_{RSTa}$.

Figure 2:
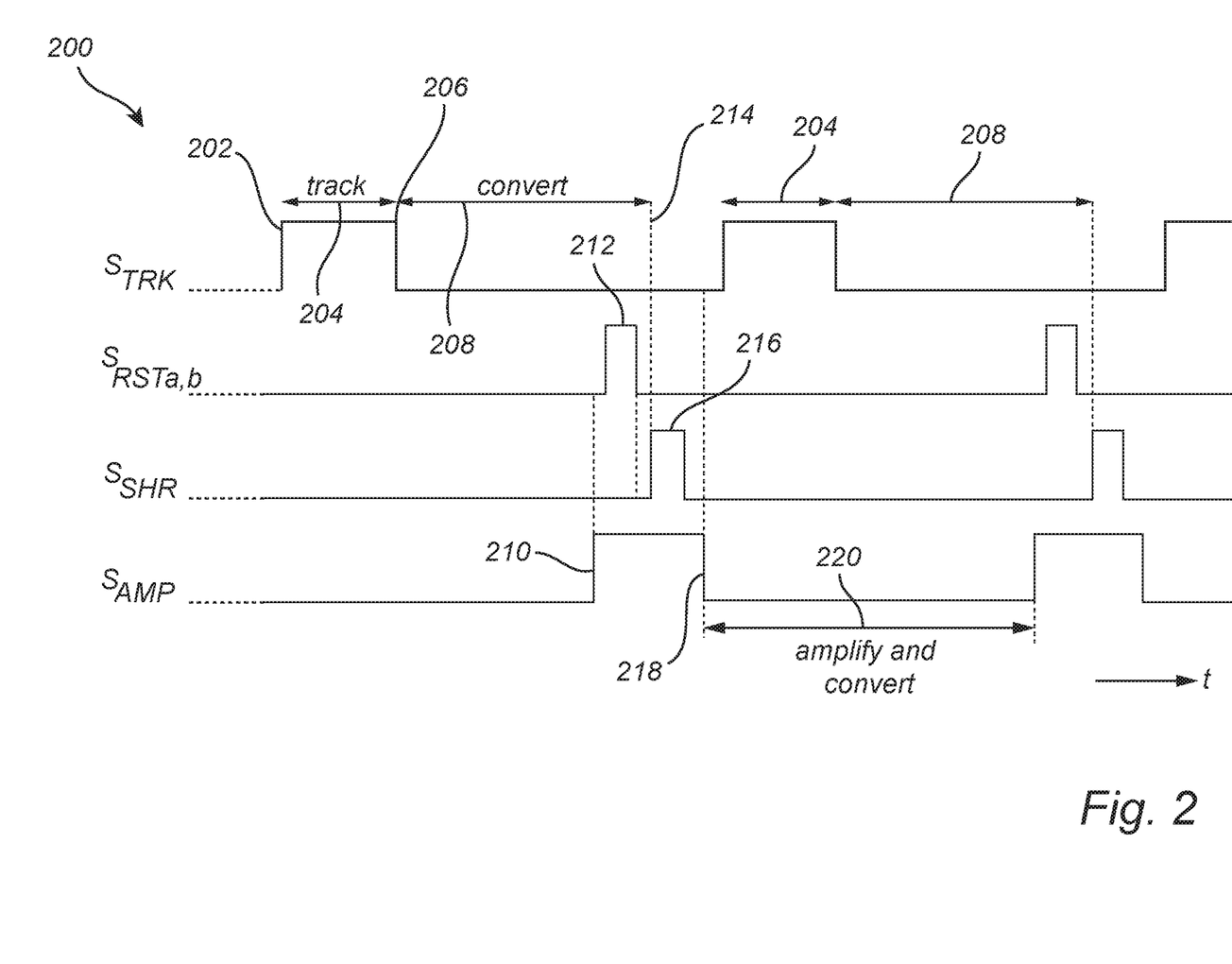
FIG. 2 is a timing diagram.

In the following, a method example 200 of analog-to-digital conversion of an analog voltage with the SAR ADC 2 of FIG. 1 will be described with reference to the timing diagram of FIG. 2 and the operation of the inter-stage residue amplifier 6 shown in FIGS. 3a and 3b.

At 202, the control signal $S_{TRK}$ is put high (leading edge) by the logic block 34, closing the switch 24. In a tracking phase 204, the lower capacitors 33b of the plurality of capacitors 32 and the capacitor 30 are charged to the input voltage vin, the other ends of the capacitors 32 being switched to ground. Meanwhile, the upper capacitors 33a of the plurality of capacitors 32 are charged to the difference of the input voltage vin and the supply voltage $V_{DD}$. Thus, the input signal is first sampled on the full DAC array of the first SAR ADC stage 4.

At 206, the control signal $S_{TRK}$ is put low (falling edge) by the logic block 34, opening the switch 24. Analog-to-digital conversion in the first SAR ADC stage 4 is performed, by successive approximation known per se, in a conversion phase 208 between 206 and 214, by the comparator 38 comparing the voltage on the common bus 36 to ground during successive switching of the capacitors of the plurality of capacitors 32 to the supply voltage $V_{DD}$ or to ground depending on the comparator 38 output.

Meanwhile, still in the conversion phase 208 between 206 and 214, a previous residue voltage from the first SAR ADC stage 4, as amplified by the inter-stage amplifier 6, is undergoing analog-to-digital conversion in the second SAR ADC stage 6, by successive approximation as known per se, by the comparator 38 comparing the resulting voltage on the input 12 to ground during successive switching of the capacitors of the plurality of capacitors 32 to the supply voltage $V_{DD}$ or to ground depending on the comparator 38 output.

Figure 3A:
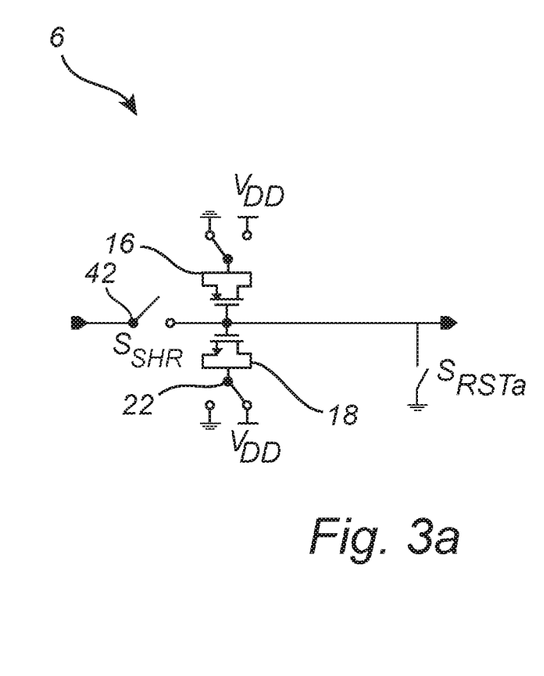
FIGS. 3a and 3b show operation of an inter-stage residue amplifier comprised in the SAR ADC of FIG. 1.

During the tracking phase 204, and at the start of the conversion phase 208, as shown in FIG. 3a, the signal line $S_{SHR}$ is kept low by one of the logic blocks 34. As a result, the switch 42 between the common bus 36 and the inter-stage amplifier 6, is open. Further, the signal line $S_{AMP}$ is low, resulting in the source and drain terminals of the NMOS transistor 18 being connected to the supply voltage $V_{DD}$ through the switch 20 and the source and drain terminals of the PMOS transistor 16 being connected to ground through the switch 22. As a result, both the NMOS transistor 18 and the PMOS transistor 16 are in depletion mode.

Figure 3B:
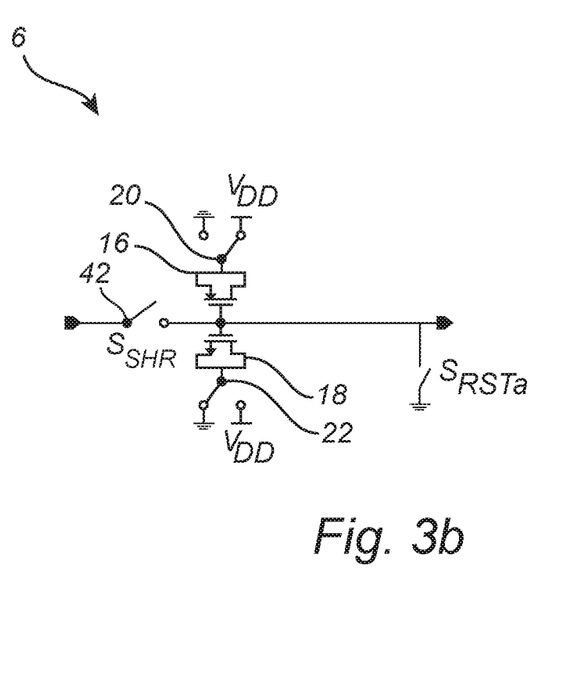

At 210, as shown in FIG. 3b, still in the conversion phase 208, the signal line $S_{AMP}$ is brought high (rising edge) by one of the logic blocks 34. Thereby, the source and drain terminals of the NMOS transistor 18 are toggled to ground by the switch 20 and the source and drain terminals of the PMOS transistor 16 are toggled to the supply voltage $V_{DD}$ by the switch 22. As a result, both the NMOS transistor 18 and the PMOS transistor 16 are brought into strong inversion mode.

At 212, through square pulses on each of the signal lines $S_{RSTa}$ and $S_{RSTb}$, respectively, switches 43 and 40 are shortened to ground, discharging the capacitors of the of the second SAR ADC stage 8.

At this time, the most significant bits of the analog level to be converted have been evaluated by the first SAR ADC stage 4, and an analog residue voltage is present on the common bus 36, ready to be transferred on to the inter-stage amplifier 6. At 214, this is performed through passive charge sharing, with a square pulse 216 on the signal line $S_{SHR}$, resulting in the switch 42 closing for a short time. Thereby, the residue voltage is input on the gate terminals of the PMOS transistor 16 and the NMOS transistor 18. With both the PMOS transistor 16 and the NMOS transistor 18 being in strong inversion mode, the analog residue voltage from the first SAR ADC stage 4 is sampled on a total capacitance $$C_{phi1} = C_{inv,P} + C_{inv,N} + C_{DAC2},$$

wherein $C_{inv,P}$ and $C_{inv,N}$ are the respective channel capacitances of the PMOS 16 and PMOS 18 transistors in strong inversion mode, and $C_{DAC2}$ is the total capacitance of the second SAR ADC stage 6 (compare FIG. 4, where $C_{DAC2}$ is symbolically represented, to FIG. 1).

At 218, the signal line $S_{AMP}$ is again brought low, resulting in the source and drain terminals of the NMOS transistor 18 being toggled to the supply voltage $V_{DD}$ by the switch 20 and the source and drain terminals of the PMOS transistor 16 being toggled to ground by the switch 22. As a result, both the NMOS transistor 18 and the PMOS transistor 16 are brought into depletion mode. The total capacitance is now $$C_{phi2} = C_{dep,P} + C_{dep,N} + C_{DAC2} \approx C_{DAC2}.$$

$C_{dep,P}$ and $C_{dep,N}$ are the respective gate capacitances of the PMOS 16 and NMOS 18 transistors in depletion mode; they are, respectively, much smaller than $C_{inv,P}$ and $C_{inv,N}$. Since the total charge transferred from the first SAR ADC stage 4 is preserved, the voltage is amplified by a factor:

$$G = \frac{C_{phi1}}{C_{phi2}} \approx \frac{C_{in,P} + C_{inv,N} + C_{DAC2}}{C_{DAC2}}.$$

Assuming that the total capacitance $C_{DAC1}$ of the first SAR ADC stage 4 (again compare FIG. 4 to FIG. 1) mainly is limited by matching requirements, its value can be made much bigger compared to the total capacitance $C_{DAC2}$ of the second SAR ADC stage 8 and of the inter-stage amplifier 6. This results in a little attenuation of the analog residue voltage of the first SAR ADC stage due to the charge sharing operation and a negligible loss in the effective gain. The capacitance $C_{BR}$ of the capacitor 40 is sized to reduce the input capacitance of the second stage and the attenuation of the residue. Including the charge sharing attenuation, the effective gain, i.e., the factor by which the residue voltage from the first successive approximation in the first SAR ADC stage is amplified, is given by:

$$G_{eff} = A_{sh} \times G = \frac{C_{DAC1}}{C_{DAC1} + C_{DAC2} + C_{inv,N} + C_{inv,P}} \times \frac{C_{DAC2} + C_{inv,N} + C_{inv,P}}{C_{DAC2}}.$$

After a sufficient settling time, the comparator 38 of the second SAR ADC stage 8 is triggered and, in a second conversion phase 220, a second successive approximation analog-to-digital conversion of the result of the amplifying is performed by the second SAR ADC stage 8, estimating the less significant bits by successive approximation known per se, by successively switching the capacitors 32 of the plurality of capacitors of the second SAR ADC stage 8 to the supply voltage $V_{DD}$ and the comparator 38, comparing the resulting voltage on the input 12 to ground.

Meanwhile, a new tracking phase 204 followed by a new conversion phase 208 is started at the first SAR ADC stage 4, as described above.

In the following, some further performance characteristics of the pipelined SAR ADC 2 and the inter-stage amplifier 6 comprised therein, will be discussed.

The inter-stage amplifier 6 performs low power-amplification and dissipates only dynamic power. The power consumption is only due to the switching of the source/drain terminals of the MOS transistors 16 and 18 from ground to the supply voltage $V_{DD}$ and vice versa. As a result, the total energy dissipated per conversion step is given by $$E = \frac{2 C_{inv,P} C_{inv,N} + C_{DAC2}(C_{inv,N} + C_{inv,P})}{C_{DAC2} + C_{inv,N} + C_{inv,P}} V_{DD}$$

Due to the fully passive nature of this architecture, the only noise contributions on the signal path are due to kT/C noise. The total noise at the input of second stage does not depend on $C_{DAC1}$ but only on the total capacitance of the backend. After the charge sharing operation, the noise is given by $$n_{sh}^2 = \frac{kT}{C_{DAC2} + C_{inv,N} + C_{inv,P}}.$$

At the falling edge 218 of $S_{AMP}$, the residue and noise are amplified by the same gain. Thus, the inter-stage amplifier 6 itself does not imply any signal-to-nose degradation. After the amplification, the noise becomes $$n_{amp}^2 = n_{sh}^2 \times \left( \frac{C_{DAC2} + C_{inv,N} + C_{inv,P}}{C_{DAC2}} \right)^2 = kT \frac{C_{DAC2} + C_{inv,N} + C_{inv,P}}{C_{DAC2}^2}.$$

In the following, some simulation results related to the pipelined SAR ADC 2 and the inter-stage amplifier 6 comprised therein, will be discussed.

Figure 5:
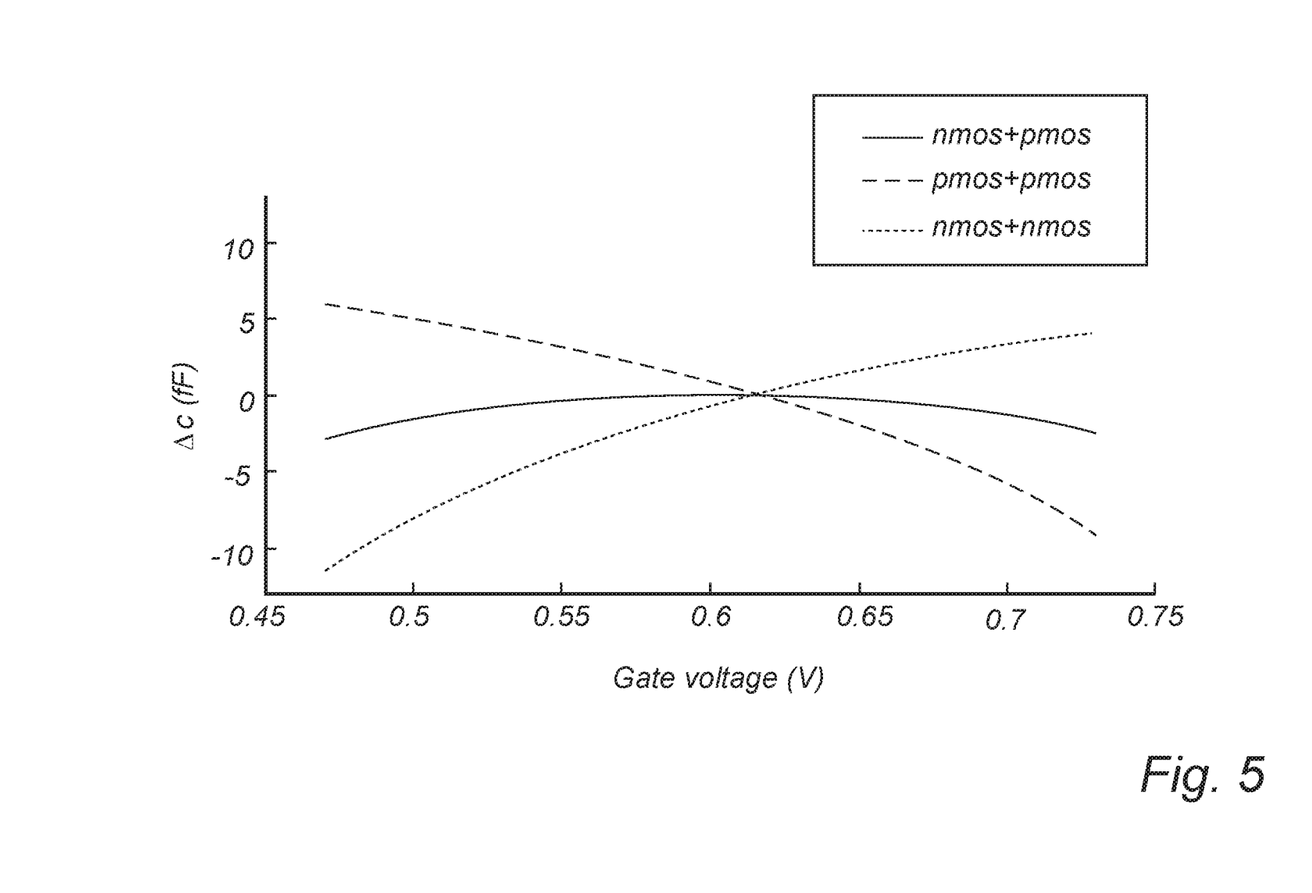
FIG. 5 shows capacitance of the inter-stage residue amplifier versus input voltage.

FIG. 5 shows the input capacitance of the inter-stage residue amplifier 6 versus input voltage. The simulation reported shows the total capacitance seen at the input of the inter-stage amplifier 6 for implementations having, respectively, two NMOS transistors 18, two PMOS transistors 16, or the complementary pair of the PMOS transistor 16 and the NMOS transistor 18. The simulation was performed for a 130 nm CMOS process for a nominal capacitance of approximately 300 fF, equally distributed between the NMOS transistors 18, the PMOS transistor 16, and the capacitor, with the transistors are equally sized. As can be seen, the implementation comprising the complementary pair improves the minimization of the dependent variation of the capacitance, yielding higher linearity compared to the implementations comprising single-type PMOS or NMOS transistors.

Figure 6A:
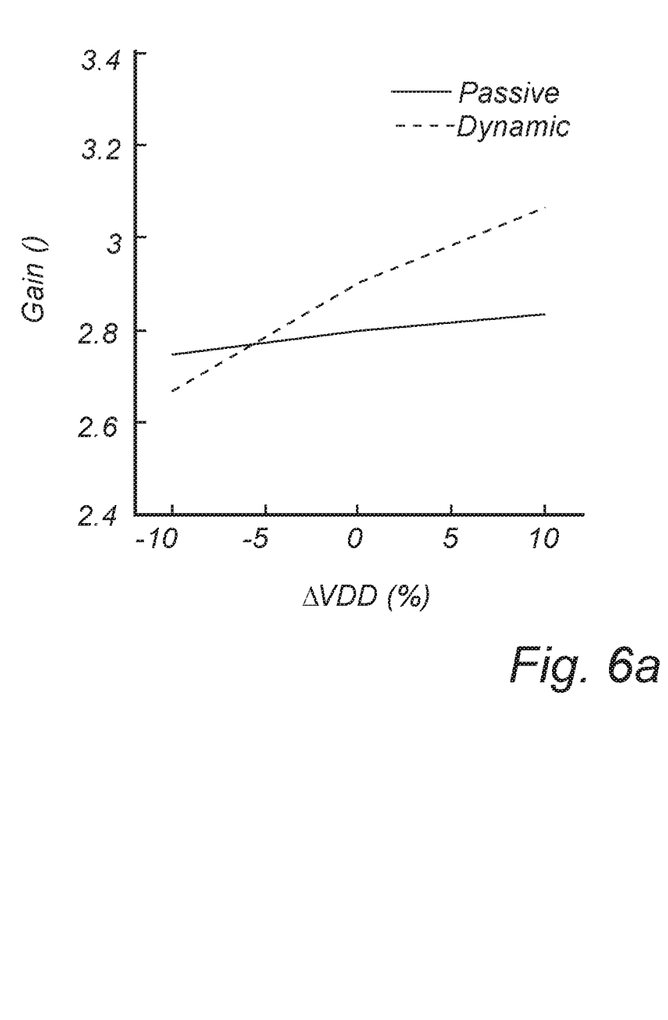
FIGS. 6a and 6b show amplifier gain versus supply voltage and temperature.
Figure 6B:
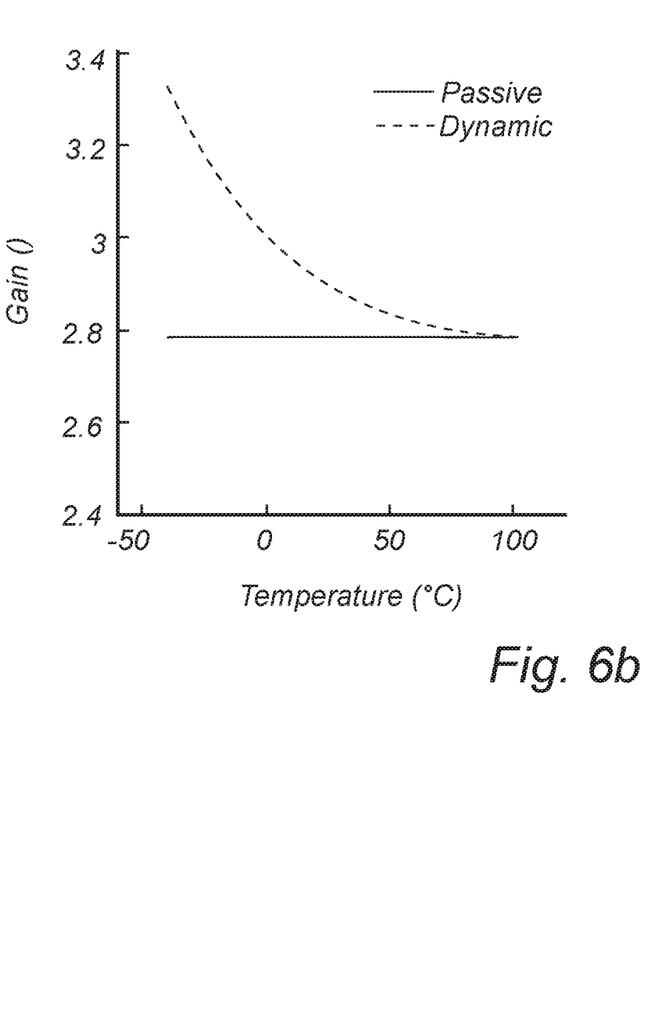

FIGS. 6a and 6b show simulated amplifier gain versus, respectively, supply voltage and temperature. The passive inter-stage amplifier 6 was in simulation with a dynamic amplifier reported, with both amplifiers implemented in a 130 nm CMOS process and designed for approximately the same gain. As can be seen, in contrast to the dynamic amplifier, the passive inter-stage amplifier 6 is more robust versus varying supply voltage and almost insensitive to temperature variations.

The effectiveness of the architecture was verified in schematic level simulations. The full circuit of the pipelined SAR ADC 2 was simulated in 130 nm CMOS process, with the first SAR ADC stage 4 and the second SAR ADC stage 8, implementing, respectively 5 bits and 6 bits, with an 8/7-bit inter-stage redundancy for an ideal quantization of 5+6− log 2(8/7)=10.8 bits. With a full scale of the ADC of 1 V, the resulting voltage range of the analog residue voltage was approximately 31 mV. Such a small range ensures enough linearity of the amplifier. The MOS capacitors 16, 18 and the capacitors of the second SAR ADC stage 8 were sized for a charge sharing attenuation of 0.9 and a gain of 3. As a result, the full scale of the second SAR was approximately 100 mV which makes quite relaxed the noise requirements of the comparator. The capacitance of each MOS transistor was approximately 100 fF, with the total input capacitance of the second SAR ADC stage 6 similarly sized. As a result, the amplifier only consumed 160 fJ per conversion step for a 1.2 V supply voltage and the input referred noise of the amplifier was 118 µV. Integral nonlinearity (INL) and differential nonlinearity (DNL) were observed to be below half the least significant bit (LSB), showing that that the linearity of the amplifier is high enough for this ADC resolution.

In the above the inventive concept has mainly been described with reference to a limited number of examples. However, as is readily appreciated by a person skilled in the art, other examples than the ones disclosed above are equally possible within the scope of the inventive concept, as defined by the appended claims. For example, one or both of the first SAR ADC stage 4 and the second SAR ADC stage 8 may provide a higher or a lower ADC resolution than depicted above, reflected in more or fewer capacitors in the plurality of capacitors 32.

The pipelined SAR ADC may provide more than two stages, for example three SAR ADC stages comprising, for example, a first SAR ADC stage, followed by a first inter-stage amplifier, followed by a second SAR ADC stage, followed by a second inter-stage amplifier.

The invention claimed is:

1. A pipelined successive approximation register analog-to-digital converter, SAR ADC, comprising:
    a first SAR ADC stage;
    an inter-stage amplifier for amplifying an analog residue from said first SAR ADC stage; and
    a second SAR ADC stage input from said inter-stage amplifier, wherein said inter-stage amplifier comprises one or more MOS transistors,
    wherein source and drain terminals of each of said one or more MOS transistors are connected to each other and are toggled or switchable between ground and a supply voltage, and
    wherein said one or more MOS transistors are directly connectable to said first SAR ADC stage and to said second SAR ADC stage.

2. The pipelined SAR ADC of claim 1, wherein said one or more MOS transistors comprise a complementary pair consisting of an NMOS transistor and a PMOS transistor.

3. The pipelined SAR ADC of claim 1, implemented in CMOS technology.

4. The pipelined SAR ADC of claim 1, wherein said second SAR ADC stage comprises an input capacitor connected to gate terminal of each of said one or more MOS transistors.

5. The pipelined SAR ADC of claim 1, wherein at least one of said first SAR ADC stage and said second SAR ADC stage is a charge redistribution SAR ADC stage.

6. The pipelined SAR ADC of claim 1, wherein each of said first SAR ADC stage and said second SAR ADC stage is a charge redistribution SAR ADC stage.

7. A method of analog-to-digital conversion of an analog level, comprising:
    performing a first successive approximation analog-to-digital conversion of said analog level;
    amplifying an analog residue from said first successive approximation by:
        directly inputting said analog residue on a gate terminal of one or more MOS transistors, wherein respective source and drain terminals of each of said one or more MOS transistors are connected to each other and are toggled or switchable between ground and a supply voltage, and
        toggling said source and drain terminals of said one or more MOS transistors, resulting in an amplified voltage on said gate terminal; and
    performing a second successive approximation analog-to-digital conversion directly on the result of said amplifying.

* * * * *